(12) United States Patent
Tacken et al.

(10) Patent No.: US 9,000,303 B2
(45) Date of Patent: Apr. 7, 2015

(54) METHOD FOR PREPARING A PATTERNED ELECTRIC CIRCUIT

(75) Inventors: Roland Anthony Tacken, Geldrop (NL); Renatus Marius De Zwart, Eindhoven (NL); Erwin Rinaldo Meinders, Veldhoven (NL); Maria Peter, Eindhoven (NL)

(73) Assignee: Nederlandse Organisatie voor toegepast-natuurwetenschappelijk onderzoek TNO, Delft (NL)

( * ) Notice: Subject to any disclaimer, the term of this patent is extended or adjusted under 35 U.S.C. 154(b) by 918 days.

(21) Appl. No.: 12/663,738

(22) PCT Filed: Jun. 16, 2008

(86) PCT No.: PCT/NL2008/050384
§ 371 (c)(1),
(2), (4) Date: Aug. 20, 2010

(87) PCT Pub. No.: WO2008/153398
PCT Pub. Date: Dec. 18, 2008

(65) Prior Publication Data
US 2011/0017495 A1    Jan. 27, 2011

(30) Foreign Application Priority Data
Jun. 14, 2007 (EP) .................................. 07110281

(51) Int. Cl.
*H05K 1/03* (2006.01)
*H05K 3/18* (2006.01)

(52) U.S. Cl.
CPC ........ *H05K 3/184* (2013.01); *H05K 2201/0129* (2013.01); *H05K 2201/0257* (2013.01); *H05K2203/0108* (2013.01); *H05K 2203/0228* (2013.01); *H05K 2203/025* (2013.01); *H05K 2203/0565* (2013.01); *H05K 2203/0713* (2013.01); *H05K 2203/1415* (2013.01)

(58) Field of Classification Search
None
See application file for complete search history.

(56) References Cited

U.S. PATENT DOCUMENTS

| 3,948,706 A | 4/1976 | Schmeckenbecher |
| 5,190,637 A * | 3/1993 | Guckel .......................... 205/118 |

(Continued)

FOREIGN PATENT DOCUMENTS

| DE | 19625386 | 1/1998 |
| EP | 0026211 | 4/1981 |

(Continued)

OTHER PUBLICATIONS

International Search Report, Application No. PCT/NL2008/050384, mailed Sep. 22, 2008.

*Primary Examiner* — Courtney Smith
(74) *Attorney, Agent, or Firm* — Renner, Otto, Boisselle & Sklar, LLP

(57) ABSTRACT

The invention provides a method for preparing a pattern for an electric circuit comprising the steps of: (a) providing a substrate; (b) providing a pattern of an inhibiting material for an electrical circuit onto said substrate by i) applying a layer of the inhibiting material onto said substrate and mechanically removing locally the layer of the inhibiting material to obtain said pattern; or ii) applying a layer of the inhibiting material onto said substrate, wherein said layer has pre-determined pattern which incompletely covers said substrate; (c) establishing a distribution of particles of a first metal or alloy thereof on the layer of the inhibiting material and the pattern as obtained in step. (b); and (d) depositing by means of an electroless process a layer of a second metal or alloy thereof on the distribution of the particles of the first metal or alloy thereof as obtained in step (c), whereby the inhibiting material that is still present on the substrate after step (b) locally inhibits the second metal or alloy thereof to be deposited on the first metal or alloy thereof, ensuring that the second metal or alloy thereof will selectively be deposited on the particles of the first metal or alloy thereof that are distributed on the pattern obtained in step (b).

15 Claims, 2 Drawing Sheets

(56) References Cited

U.S. PATENT DOCUMENTS

| | | |
|---|---|---|
| 6,277,740 B1 | 8/2001 | Goldstein |
| 2006/0011486 A1* | 1/2006 | Lockard et al. ............... 205/136 |
| 2008/0075836 A1* | 3/2008 | Chen et al. ..................... 427/58 |

FOREIGN PATENT DOCUMENTS

| | | |
|---|---|---|
| EP | 0 231 795 A2 | 8/1987 |
| EP | 0 483 484 A2 | 5/1992 |
| GB | 942158 | 11/1962 |
| GB | 1175832 | 12/1969 |

* cited by examiner

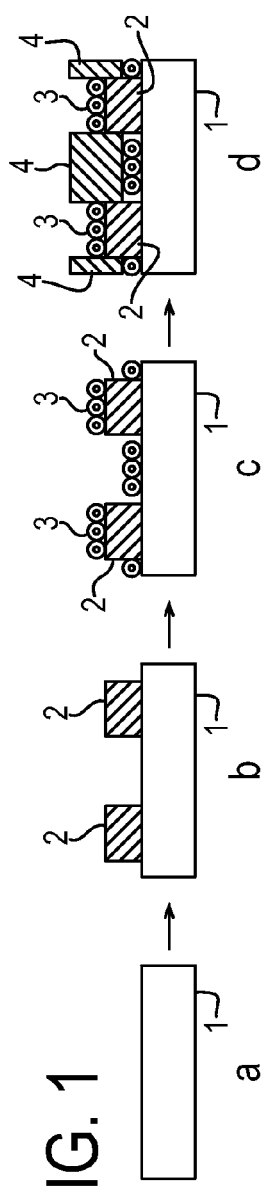
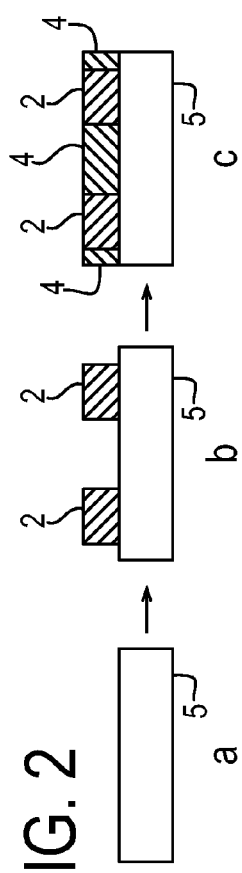
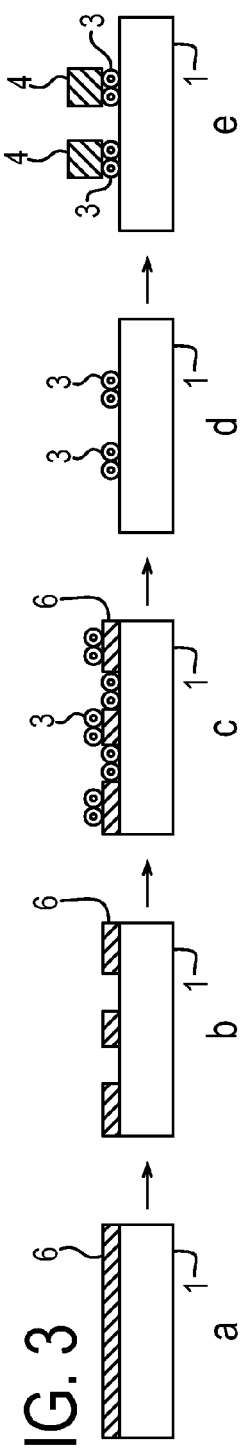

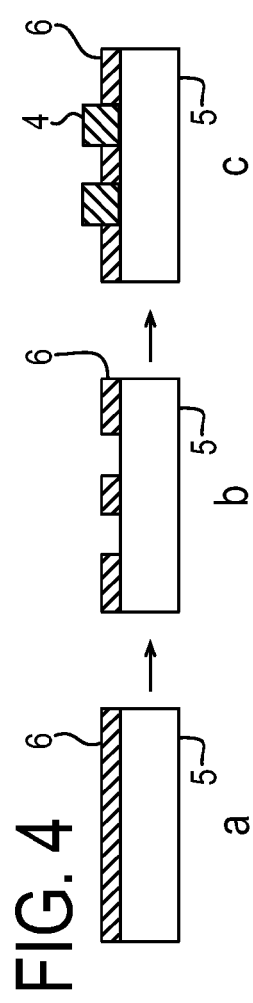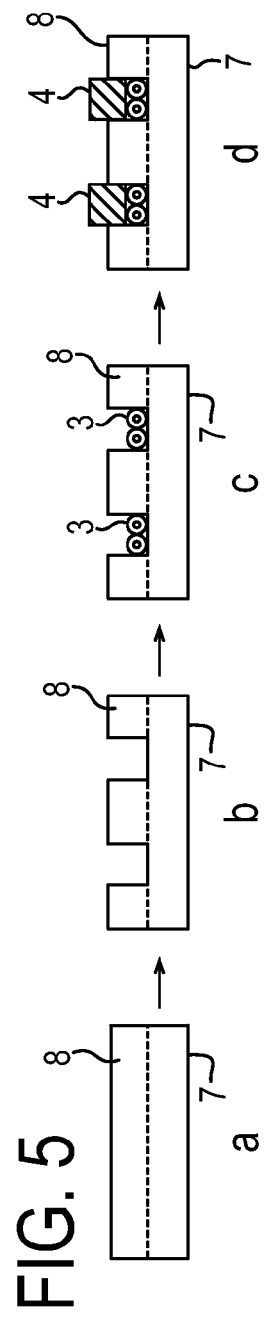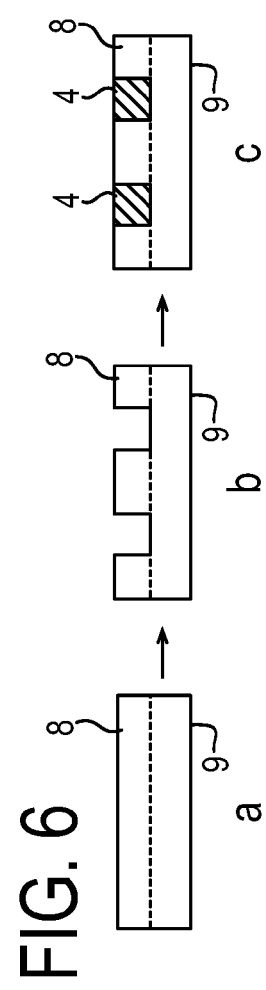

METHOD FOR PREPARING A PATTERNED ELECTRIC CIRCUIT

This application is a national phase of International Application No. PCT/NL2008/050384 filed Jun. 16, 2008.

The invention relates to methods for preparing patterned electric circuits.

Methods to prepare patterns for electric circuits are well-known. Such patterns can, for instance, be made by providing a dielectric with a metal layer and removing part of the metal layer by means of chemical etching to yield a particular metal circuit pattern. It will be understood that electric circuits produced in this way are typically 2-dimensional (boards) and do not permit 3-dimensional circuit generation.

To create 3-dimensional electrical circuits MID-technology (Moulded Interconnect Device) has been developed [1]. The two main technologies to create MIDs are 2-component moulding technology and laser direct structuring.

In the past years, in view of MID and 2K injection moulding applications, different types of precatalysed polymer granules have entered the market. Examples are Vectra 820i Pd of Ticona which comprises Pd particles and Vestodur PBT of Degussa which comprises an iron pigment that, after a chemical release, has the same catalysing function as Pd for a subsequent electroless metallisation process. Using such a precatalysed polymer in combination with a non-precatalysed polymer in a 2K injection moulding process, enables the preparation of a product that can be selectively metallised. In this way, a 3-dimensional electric circuit can be created on a two-component plastic substrate, such as a substrate comprises one component onto which partly or completely a second component has been applied, or instance by moulding. Such components can suitably be thermoplastics. A drawback of the use of two plastics is that these have different thermo-mechanical properties which can cause bad adhesion and voids at the interfaces in the 2-component product. Moreover, moulds for 2-component moulding are extremely expensive and elaborate to make.

Another technique for preparing patterns for electric circuits is the so-called Laser Direct Structuring method wherein a pattern is prepared on an injection moulded one-component polymer substrate which is for instance made of LCP grade for LDS (supplier Ticona) that is seeded with a particular metal in the form of a laser sensitive metal complex. When a laser is selectively applied to the surface of the polymer substrate, the metal complex present at or near the surface is converted into the corresponding elemental metal, resulting in a particular pattern of said metal. Subsequently, another layer of metal can be applied on the metal pattern so obtained. A drawback of this technique is that the laser equipment and setup is expensive. Moreover, the technique is only very limited in its 3-dimensional capability. In addition, the method can only create a metallic pattern on parts of the product that can be illuminated with the laser and which are not shadowed by another feature on the product. For this reason, also the creation of metallised through-holes is only possible in a limited way.

Object of the invention is to provide relatively inexpensive and simple methods for 3-dimensional patterns for electric circuits that have a larger dimensional flexibility than the state-of-the-art methods described above, and that can be applied on one-component injection moulded parts.

Further object of the invention is to provide methods for preparing a pattern for an electrical circuit, which method is applicable for 3-dimensional as well as for 2-dimensional electrical circuits.

Surprisingly, it has now been found that that this object can be realised when the patterns for the electric circuits are prepared by means of a mechanical treatment.

Accordingly, one aspect of the invention relates to a method for preparing a pattern for an electric circuit comprising the steps of:
(a) providing a substrate;
(b) providing a pattern of an inhibiting material for an electrical circuit onto said substrate by
   i) applying a layer of the inhibiting material onto said substrate and mechanically removing locally the layer of the inhibiting material to obtain said pattern; or
   ii) applying a layer of the inhibiting material onto said substrate, wherein said layer has pre-determined pattern which incompletely covers said substrate;
(c) establishing a distribution of particles of a first metal or alloy thereof on the layer of the inhibiting material and the pattern as obtained in step (b); and
(d) depositing by means of an electroless process a layer of a second metal or alloy thereof on the distribution of the particles of the first metal or alloy thereof as obtained in step (c), whereby the inhibiting material that is still present on the substrate after step (b) locally inhibits the second metal or alloy thereof to be deposited on the first metal or alloy thereof, ensuring that the second metal or alloy thereof will selectively be deposited on the particles of the first metal or alloy thereof that are distributed on the pattern obtained in step (b).

Suitably, the distribution of the particles of the first metal or alloy thereof on the layer of the inhibiting layer and the pattern in step (c) is established by means of adsorption from a solution of nanoparticles.

Further, the invention also provides a method for preparing a pattern for an electric circuit comprising the steps of:
(a) providing a substrate, which substrate comprises a first metal or alloy thereof;
(b) providing a pattern of an inhibiting material for an electrical circuit onto said substrate by
   i) applying a layer of the inhibiting material onto said substrate and mechanically removing locally the layer of the inhibiting material, thereby exposing at least part of the first metal or alloy thereof present in the substrate; or
   ii) applying a layer of the inhibiting material onto said substrate, wherein said layer has pre-determined pattern which incompletely covers said substrate, thereby exposing at least part of the first metal or alloy thereof present in the substrate;
(c) depositing by means of an electroless process a layer of a second metal or alloy thereof on the exposed part of the first metal or alloy thereof present in the substrate as obtained in step (b), whereby the inhibiting material that is still present on the substrate after step (b) locally inhibits the second metal or alloy thereof to be deposited on the first metal or alloy thereof, ensuring that the second metal or alloy thereof will selectively be deposited on the exposed part of the first metal or alloy thereof as obtained in step (b).

Another aspect of the invention relates to a method for preparing a pattern for an electric circuit comprising the steps of:
(a) providing a substrate onto which a coating has been applied;
(b) removing mechanically, thermally or laser-induced locally the coating to obtain a pattern for an electric circuit;
(c) establishing a distribution of particles of a first metal or alloy thereof on the coating and the pattern as obtained in step (b);
(d) removing the coating from the substrate; and (e) depositing by means of an electroless or electrochemical process a layer of a second metal or alloy thereof on the particles of the first metal or alloy thereof that are distributed on the pattern in step (c).

Suitably, the distribution of the particles of the first metal or alloy thereof on the coating and the pattern is established in step (c) by means of adsorption of nanoparticles from a solution. In step (d) the coating can suitably be removed from the substrate by means of dissolution in a solvent.

The invention also provides a method for preparing a pattern for an electric circuit comprising the steps of:
(a) providing a substrate onto which a coating has been applied, which substrate comprises a first metal or alloy thereof;
(b) removing mechanically, thermally or laser-induced locally the coating so as to obtain a pattern for an electric circuit, thereby exposing at least part of the first metal or alloy thereof present in the substrate; and
(c) depositing by means of an electroless or electrochemical process a layer of a second metal or alloy thereof on the exposed part of the first metal or alloy thereof present in the substrate as obtained in step (b).

In addition, the invention provides a method for preparing a pattern for an electric circuit comprising the steps of:
(a) providing a substrate of which the skin part is more hydrophobic than the internal part of the substrate;
(b) removing mechanically, thermally or laser-induced locally the skin part to obtain a pattern for an electric circuit, thereby exposing at least part of the internal part of the substrate;
(c) establishing a distribution of particles of a first metal or alloy thereof on the exposed part of the internal part of the substrate as obtained in step (b); and
(d) depositing by means of an electroless process a layer of a second metal or alloy thereof on the particles of the first metal or alloy thereof that are distributed on the pattern in step (c).

Suitably, the distribution of the particles of the first metal or alloy thereof on the exposed part of the internal part of the substrate as obtained in step (b) is established in step (c) by means of adsorption from a solution of nanoparticles.

Yet another aspect of the invention relates to a method for preparing a pattern for an electric circuit comprising the steps of:
(a) providing a substrate of which the skin part is more hydrophobic than the internal part of the substrate, which substrate comprises a first metal or alloy thereof;
(b) removing mechanically, thermally or laser-induced locally the skin part so as to obtain a pattern for an electric circuit, thereby exposing at least part of the first metal or alloy thereof present in the substrate; and
(c) depositing by means of an electroless process a layer of a second metal or alloy thereof on the exposed part of the first metal or alloy thereof present in the substrate as obtained in step (b).

Suitably, the distribution of the particles of the first metal or alloy thereof on the coating and the pattern, on the layer of the inhibiting material and the pattern or on the exposed part of the internal part of the substrate is established by means of adsorption from a solution of nanoparticles.

Suitably, the coating, the layer of inhibiting material or the skin part is mechanically removed in step (b) by means of milling, scraping, drilling, impressing, embossing or hot embossing. However, the coating, the layer of inhibiting material or the skin part can also be removed thermally. Further it is possible that removal of the coating, the layer of inhibiting material or the skin part is laser-induced.

DESCRIPTION OF THE DRAWINGS

FIG. 1 shows an example of a method for preparing a patterned electric circuit comprising the steps of:
(a) providing a substrate (1);
(b) providing a pattern of an inhibiting material (2) for an electrical circuit onto said substrate (1) by
  i) applying a layer of the inhibiting material (2) onto said substrate (1) and mechanically removing locally the layer of the inhibiting material (2) to obtain said pattern; or
  ii) applying a layer of the inhibiting material (2) onto said substrate (1), wherein said layer has a pre-determined pattern which incompletely covers said substrate (1);
(c) establishing a distribution of particles of a first metal or alloy thereof (3) on the layer of the inhibiting material (2) and the pattern as obtained in step (b); and
(d) depositing by means of an electroless process a layer of a second material or alloy thereof (4) on the distribution of the particles of the first metal or alloy thereof (3) as obtained in step (c), whereby the inhibiting material (2) that is still present on the substrate (1) after step (b) locally inhibits the second metal or alloy thereof (4) to be deposited on the first metal or alloy thereof (3), ensuring that the second metal or alloy thereof (4) will selectively be deposited on the particles of the first metal or alloy thereof (3) that are distributed on the pattern obtained in step (b).

FIG. 2 shows an example of a method for preparing a pattern for an electric circuit comprising the steps of:
(a) providing a substrate, which substrate comprises a first metal or alloy thereof (5);
(b) providing a pattern of an inhibiting material (2) for an electrical circuit onto said substrate by
  i) applying a layer of the inhibiting material (2) onto said substrate (5) and mechanically removing locally the layer of the inhibiting material (2), thereby exposing at least part of the first metal or alloy thereof present in the substrate (5); or
  ii) applying a layer of inhibiting material (2) onto said substrate, wherein said layer has a pre-determined pattern which incompletely covers said substrate, thereby exposing at least part of the first metal or alloy thereof present in the substrate (5);
(c) depositing by means of an electroless process a layer of a second metal or alloy thereof (4) on the exposed part of the first metal or alloy thereof present in the substrate (5) as obtained in step (b), whereby the inhibiting material (2) that is still present on the substrate after step (b) locally inhibits the second metal or alloy thereof (4) to be deposited on the first metal or alloy thereof, ensuring that the second metal or alloy thereof (4) will selectively be deposited on the exposed part of the first metal or alloy thereof as obtained in step (b).

FIG. 3 shows an example of a method for preparing a pattern for an electric circuit comprising the steps of:
(a) providing a substrate (1) onto which a coating (6) has been applied;
(b) removing mechanically, thermally or laser-induced locally the coating (6) to obtain a pattern for an electric circuit;
(c) establishing a distribution of particles of a first metal or alloy thereof (3) on the coating (6) and the pattern as obtained in step (b);
(d) removing the coating (6) from the substrate (1); and
(e) depositing by means of an electroless or electrochemical process a layer of a second metal or ally thereof (4) on the particles of the first metal or alloy thereof (3) that are distributed on the pattern in step (c).

FIG. 4 shows an example of a method for preparing a pattern for an electric circuit comprising the steps of:

(a) providing a substrate (5) onto which a coating (6) has been applied, which substrate (5) comprises a first metal or alloy thereof;

(b) removing mechanically, thermally or laser-induced locally the coating (6) so as to obtain a pattern for an electric circuit, thereby exposing at least part of the first metal or alloy thereof present in the substrate (5); and (c) depositing by means of an electroless or electrochemical process a layer of a second metal or alloy thereof (4) on the exposed part of the first metal or alloy thereof present in the substrate (5) as obtained in step (b).

FIG. 5 shows an example of a method for preparing a pattern for an electric circuit comprising the steps of:

(a) providing a substrate (7) of which the skin part (8) is more hydrophobic than the internal part of the substrate (7);

(b) removing mechanically, thermally or laser-induced locally the skin part (8) to obtain a pattern for an electric circuit, thereby exposing at least part of the internal part of the substrate (7);

(c) establishing a distribution of particles o a first metal or alloy thereof (3) on the exposed part of the internal part of the substrate (7) as obtained in step (b); and (d) depositing by means of an electroless process a layer of a second metal or alloy thereof (4) on the particles of the first metal or alloy thereof (3) that are distributed on the pattern in step (c).

FIG. 6 shows an example of a method for preparing a pattern for an electric circuit comprising the steps of:

(a) providing a substrate (9) of which the skin part (8) is more hydrophobic than the internal part of the substrate (9), which substrate (9) comprises a first metal or alloy thereof;

(b) removing mechanically, thermally or laser-induced locally the skin part (8) so as to obtain a pattern for an electric circuit, thereby exposing at least part of the first metal or alloy thereof present in the substrate (9); and (c) depositing by means of an electroless process a layer of a second metal or alloy thereof (4) on the exposed part of the first metal or alloy thereof present in the substrate (9) as obtained in step (b).

The substrate to be used in accordance with the invention can suitably comprise thermoplastic materials like liquid crystalline polymer (LCP), polyamide (PA6, PA6,6, PA4,6, PA12), polyphenylenesulphide (PPS), polyetherimide (PEI), polybutadieneterephtalate (PBT), syndiotactic polystyrene (SPS), polycarbonate (PC), acrylonitrile-butadiene-styrene (ABS), PC/ABS-blends, polypropylene (PP), polyethylene (PE), and others.

Preferably, the substrate comprises LCP, polyamide, PEI, ABS or PC/ABS.

The substrate can have any thickness depending of course on the use concerned. Suitably, the thickness can, for instance, be in the range of from 0.5 mm-10 mm.

The first metal or alloy thereof to be used in the invention can suitably be selected from the group consisting of cobalt, nickel, copper, rhodium, palladium, platinum, silver and gold.

Preferably, the first metal is palladium.

In accordance with the invention the distribution of the first metal or alloy thereof is such that a layer of the first metal or alloy thereof is obtained. In the context of the present application, as any skilled person will appreciate, the layer of the first metal will actually be a coverage of islands of nanoparticles on the substrate. Hence, such a coverage will usually not constitute an uniform complete film.

The second metal or alloy thereof to be used in the invention can suitably be selected from the group consisting of copper, nickel, nickel-phosphorous, nickel-boron, tin, silver, gold, and alloys thereof.

Preferably, the second metal is copper, nickel-phosphorous or nickel-boron.

The layer of the second metal or alloy thereof can suitably have a thickness in the range of from 1 to 30 micrometer, more preferably a thickness in the range of from 3 to 15 micrometer.

The coating to be used in accordance with the invention can suitably be selected from the group consisting of poly(styrene), poly(butadiene), poly(propylene), poly(ethylene), poly(carbonate), poly(etherether ketone), poly(vinylchloride), poly(vinylidene chloride), poly(vinylidene fluoride), poly(tetrafluoroethylene), poly(acrylate), poly(phenylene sulfide), poly(sulphone), poly(ethersulphone), poly(ethyleneterephthalate), poly(ethylenenaphthalate), poly(butylterephthalate), poly(caprolactone), poly(ester), poly(vinyl alcohol), poly(vinyl ether), poly(siloxane), poly(acrylonitrile), poly(caprolactam), poly(amide), parylene, poly(naphthalene), poly(imides), acrylates, epoxides, epoxies, epoxy-amines, vinyl monomers, phenolic resins, wax, grease and melamines.

The coating can suitably have a thickness in the range of 1 micrometer to 2 mm. Preferably, the coating has a thickness in the range of from 0.3 to 1 mm.

The inhibiting material to be used in accordance with the invention suitably comprises any material that is known to inhibit or stabilise electroless deposition processes, e.g. heavy metal ions, organic and inorganic sulphur-, selenium or tellur-containing compounds, oxygen containing compounds and aliphatic and unsatisfied organic compounds. Preferably, the inhibiting material comprises thiourea, dodecanethiol, dipyridil, lead acetate, maleic acid or 2-mercaptobenzothiazole. Most preferably, the inhibiting material comprises 2-mercaptobenzothiazole or thiourea.

The layer of inhibiting material can suitably be an incomplete adsorbed surface coverage, an adsorbed monolayer or a multilayer. Thus, the layer of inhibiting material can be a uniform layer, but also a layer of incomplete coverage, consisting of multiple, individual or connected parts. As such, the inhibitor layer may be applied locally (such as with a stamp or with a suitable printing method such as inkjet printing) in a pre-determined pattern in order to obtain a selective metallisation on the areas where no inhibitor is present. In case the inhibiting material is applied locally, providing a pre-determined pattern, the step of mechanically removing part of the inhibiting material to obtain a pattern may be omitted.

When use is made of a substrate of which the skin part is more hydrophobic than the internal part of the substrate, such skin part can suitably have a thickness in the range of from 1 to 300 micrometer. Suitably, such a skin part has a contact angle for water of at least 30 degrees higher than the internal part of the substrate. Preferably, such a skin part has a contact angle for water of at least 50 degrees higher than the internal part of the substrate.

In an electroless plating process use is made of the principle that a metal which is available in ionic form in solution can be reduced by a reducing agent into its metallic form on a suitable catalytic surface. Moreover, the metal itself should also be catalytic to the reduction reaction, rendering the process autocatalytic as such For general descriptions on electroless plating processes reference can, for instance, be made to *Electroless Plating Fundamentals & Applications*, edited by Glenn O. Mallory and Juan B. Hajdu, New York (1990) [2].

In the electroless plating process suitably use is made of a solution containing the second metal to be deposited on the distribution of the first metal. Suitable metal-containing solutions include, but are not limited to, solutions water-based solutions of copper salts (e.g. copper sulphate) and formaldehyde as reducing agent, and water based solution of nickel sulphate with hypophosphite, dimethylaminoborane or sodium borohydride as reducing agent.

The invention also relates to an electric circuit comprising a pattern as prepared by means of the method according to the invention.

In addition, the invention relates to device comprising an electric device in accordance with the invention. Suitable examples of such devices include but are not limited to interconnection parts or sensors for use in vehicles, computers, digital cameras and mobile phones.

EXAMPLES

Example 1

A synthetic polymer substrate made of PA46 stanyl, with dimensions (Width×Height×Thickness) 65 mm×70 mm×4 mm was selectively plated with copper, using the following sequence of process steps:

At first the substrate was coated with an inhibitor by immersing the substrate during a couple of minutes in a solution of 30 g/l thiourea respectively 30 g/l 2-mercaptobenzothiazole (2-MBT). After immersion the sample was rinsed with (demineralised) water. The coating so obtained was locally removed by milling a pattern with different depths and track widths. Subsequently, a distribution of a palladium catalyst was established on the coating using the commercially available colloidal catalysing process Cu9040-Cu9050 of Cookson Electronics. The substrate so obtained was rinsed during 1 minute in (demineralised) water. Then, a layer of copper was deposited on the substrate during 5 minutes at 40° C. using the commercially available electroless copper bath Cu9070 of Cookson Electronics. Metal deposition occurred solely in the milled tracks.

Example 2

A synthetic polymer substrate made of PA46 stanyl, with dimensions (Width×Height×Thickness) 65 mm×70 mm×4 mm was selectively plated with nickel, using the following sequence of process steps: At first the substrate was coated with an inhibitor by immersing the substrate during a couple of minutes in a solution of 30 g/l 2-mercaptobenzothiazole (2-MBT). After immersion, the substrate so obtained was rinsed with (demineralised) water. The coating so obtained was locally removed by milling to obtain a pattern with different depths and track widths. Subsequently, a distribution of palladium catalyst was established, using an ionic catalysing process. In order to establish this, the substrate was immersed during 2 minutes in a solution of 10 g/l $SnCl_2$ and 40 ml/l HCl. After immersion, the substrate so obtained was rinsed with (demineralised) water during 1 minute. After rinsing, the substrate was immersed during 1 minute in a solution of 0.25 g/l $PdCl_2$ and 2.5 ml/l HCl at room temperature. The substrate so obtained was then rinsed during 1 minute in (demineralised) water. Subsequently, a layer of nickel wad deposited on the substrate during 5 minutes at 80° C. using the commercially available electroless nickel bath EN439 of Cookson Electronics.

Metal deposition occurred solely in the milled tracks.

Example 3

A synthetic polymer substrate made of PA46 stanyl, with dimensions (Width×Height×Thickness) 65 mm×70 mm×4 mm was selectively plated with nickel, using the following sequence of process steps: At first the substrate was coated with a inhibitor by immersing the substrate during a couple of minutes in a solution of 30 g/l thiourea respectively 30 g/l 2-mercaptobenzothiazole (2-MBT).

After immersion, the substrate was rinsed with (demineralised) water. The coating so obtained was locally impressed with a metal stamp to obtain a pattern with different depths and track widths. Subsequently, a distribution of palladium catalyst was established, using an ionic catalysing process. In order to establish this, the substrate was immersed during 2 minutes in a solution of 10 g/l $SnCl_2$ and 40 ml/l HCl. After immersion, the sample was rinsed with (demineralised) water during 1 minute. After rinsing, the substrate so obtained was immersed during 1 minute in a solution of 0.25 g/l $PdCl_2$ and 2.5 ml/l HCl at room temperature. Then, the substrate was rinsed during 1 minute in (demineralised) water. Subsequently, a layer of nickel was deposition on the substrate during 5 minutes at 60° C. in an electroless nickel bath having a pH value of 6.1 and containing 24 g/l $NiCl_2.6H_2O$; 30 g/l $C_3H_6O_3$ (lactic acid); 15 g/l $CH_3COONa$ (sodium acetate); and 2.5 g/l dimethylammoniumborane. Metal deposition occurred solely in the track created by stamping.

Example 4

A synthetic substrate made of Ticona Vectra E820i Pd, which was pre-catalyzed with a distribution of a palladium catalyst, with dimensions (Width×Height×Thickness) 65 mm×70 mm×4 mm was selectively plated with copper, using the following sequence of process steps:

At the surface of the substrate was the palladium catalyst was locally exposed by milling to obtain a pattern with different depths and track widths. Subsequently, a layer of nickel was deposited on the substrate during 20 minutes at 48° C. using the commercially available electroless copper bath Cu9070 of Cookson Electronics. Metal deposition occurred solely in the milled tracks.

Example 5

A synthetic substrate made of Ticona Vectra E820i Pd, which was pre-catalysed with a distribution of a palladium catalyst, with dimensions (Width×Height×Thickness) 65 mm×70 mm×4 mm was selectively plated with copper, using the following sequence of process steps:

At the surface of the substrate the palladium catalyst was locally exposed by milling to obtain a pattern with different depths and track widths. Subsequently, a layer of nickel was deposited at 60° C. in a similar electroless nickel bath as used in Example 3.

Example 6

A synthetic substrate made of Ticona Vectra E820i, with dimensions (Width×Height×Thickness) 65 mm×70 mm×4 mm was selectively plated with copper, using the following sequence of process step: At first the substrate was coated with a inhibitor by immersing the substrate during a couple of minutes in a solution of 30 ml/l dodecanethiol respectively 30 g/l 2-mercaptobenzothiazole (2-MBT). After immersion, the substrate obtained was rinsed with (demineralised) water. Subsequently, the coating was locally removed by scraping to obtain a pattern with different depths and track widths. Then, a distribution of a palladium catalyst was established on the substrate, using the commercially available colloidal catalysing process Cu9040-Cu9050 of Cookson Electronics. The substrate so obtained was then rinsed during 1 minute in (demineralised) water. Thereafter, a layer of copper was deposited on the substrate during 5 minutes at 40° C. in the commercially available electroless copper bath Cu9070 of Cookson Electronics. Metal deposition occurred solely in the milled tracks.

Example 7

A synthetic substrate which was made of Ticona Vectra E820i, with dimensions (Width×Height×Thickness) 65 mm×70 mm×4 mm was selectively plated with nickel, using the following sequence of process steps: At first the substrate was coated with a inhibitor by immersing the substrate during a couple of minutes in a solution of 30 ml/l dodecanthiol respectively 30 g/l 2-mercaptobenzothiazole (2-MBT). After immersion, the substrate was rinsed with (demineralised) water. Subsequently, the coating so obtained was locally removed by milling to obtain a pattern with different depths and track widths. Then, a distribution of a palladium catalyst was established on the substrate using an ionic catalysing process. In order to establish this, the substrate was immersed during 2 minutes in a solution of 10 g/l $SnCl_2$ and 40 ml/l HCl. After immersion, the substrate so obtained sample was rinsed with (demineralised) water during 1 minute. After rinsing, the substrate was immersed during 1 minute in a solution of 0.25 g/l $PdCl_2$ and 2.5 ml/l HCl at room temperature. The substrate was subsequently rinsed during 1 minute in (demineralised) water. Then, a layer of nickel was deposited on the substrate during 5 minutes at 80° C. using the commercially available electroless nickel bath EN439 of Cookson Electronics. Metal deposition occurred solely in the milled tracks.

Example 8

A synthetic substrate which was made of Ticona Vectra E820i, with dimensions (Width×Height×Thickness) 65 mm×70 mm×4 mm was selectively plated with nickel, using the following sequence of process steps: At first the substrate was coated with a inhibitor by immersing the substrate during a couple of minutes in a solution of 30 ml/l dodecanthiol respectively 30 g/l 2-mercaptobenzothiazole (2-MBT). After immersion, the substrate so obtained was rinsed with (demineralised) water. Then, the coating so obtained was locally removed by scraping to obtain a pattern with different depths and track widths. Subsequently, a distribution of a palladium catalyst was established on the substrate using a ionic catalysing process. In order to establish this, the substrate was immersed during 2 minutes in a solution of 10 g/l $SnCl_2$ and 40 ml/l HCl. After immersion, the substrate was rinsed with (demineralised) water during 1 minute. After rinsing, the substrate was immersed during 1 minute in a solution of 0.25 g/l $PdCl_2$ and 2.5 ml/l HCl at room temperature. The substrate so obtained was then rinsed during 1 minute in (demineralised) water. Then, a layer of nickel was deposited on the substrate during 5 minutes at 60° C. using a similar electroless nickel bath as described in Example 3 Metal deposition occurred solely in the milled tracks.

Example 9

A synthetic substrate made of PA46 Stanyl, was coated with a commercially available polyurethane coating. The coating so obtained was locally removed by milling to obtain a pattern with different depths and track widths.

In the next step a distribution of a palladium catalyst was established on the surface of a first sample of the substrate using an ionic catalysing process, whereas on a second sample of the substrate a distribution of the palladium catalyst was established by means of a colloidal catalysing process.

In the ionic catalysing process the substrate was immersed in a solution of 10 g/l $SnCl_2$ and 40 ml/l HCl, for 2 minutes at room temperature, whereafter the substrate so obtained was rinsed with (demineralised) water. The substrate so obtained was then immersed in a solution of 0.25 g/l $PdCl_2$ and 2.5 ml/l HCl, for 1 minute at room temperature. The substrate so obtained was then rinsed with (demineralised) water. In the colloidal catalysing process use was made of the commercially available colloidal catalysing process of, Cookson Electronics, wherein the substrate was immersed during 2 minutes in the Cu9040 solution at room temperature. Subsequently, the substrate was rinsed with (demineralised) water. The substrate so obtained was then immersed during 2 minutes in the Cu9050 solution at 40° C., and subsequently rinsed with (demineralised) water. After the distribution of the palladium catalyst on the surface of the substrate was established, the coating was removed by immersing the substrate in a dichloromethane.

On one sample of the substrate so obtained a copper layer was deposited on the substrate by means of a commercially available electroless copper bath Cu9070 of Cookson Eletronics, whereas on another sample of the substrate so obtained a nickel layer was deposited on the substrate using a similar electroless nickel bath as described in Example 3.

The surface of the substrates so obtained which had been coated contained no metal depositions, and the part were the coating was removed was plated either with copper or nickel.

Example 10

A synthetic substrate made of Ticona Vectra E820i Pd, which was pre-catalysed with a palladium catalyst, was coated with a commercially available epoxy coating. The coating so obtained was locally removed by milling to obtain a pattern with different depths and track widths. Subsequently, the coating was removed by immersing the substrate in dichloromethane.

At the surface of a sample of the substrate so obtained was then a layer of copper deposited using the electroless copper bath Cu9070 as described in Example 9, whereas at the surface of another sample of the substrate so obtained a layer of nickel was deposited using electroless nickel bath as described in Example 3.

The surface of the samples of the substrate which had been coated contained no metal deposition, and the part were the coating was removed was plated either with copper or nickel.

Example 11

A synthetic polymer substrate made of PA46 stanyl, with dimensions (Width×Height×Thickness) 65 mm×70 mm×4 mm was selectively plated with nickel, using the following sequence of process steps: At first the substrate was coated patternwise with a inhibitor by pressing a structured PDMS (polydimethylsiloxane) stamp filled with a solution of 30 g/l 2-mercaptobenzothiazole (2-MBT) during 30 seconds against the substrate to obtain a pattern with different depths and track widths.

After immersion, the substrate was rinsed with (demineralised) water. Subsequently, a distribution of palladium catalyst was established, using an ionic catalysing process. In order to establish this, the substrate was immersed during 2 minutes in a solution of 10 g/l $SnCl_2$ and 40 ml/l HCl. After immersion, the sample was rinsed with (demineralised) water during 1 minute. After rinsing, the substrate so obtained was immersed during 1 minute in a solution of 0.25 g/l $PdCl_2$ and 2.5 ml/l HCl at room temperature. Then, the substrate was rinsed during 1 minute in (demineralised) water. Subsequently, a layer of nickel was deposition on the substrate during 5 minutes at 60° C. in an electroless nickel bath having a pH value of 6.1 and containing 24 g/l $NiCl_2.6H_2O$; 30 g/l $C_3H_6O_3$ (lactic acid); 15 g/l $CH_3COONa$ (sodium acetate); and 2.5 g/l dimethylammoniumborane. Metal deposition occurred solely in the areas that had not been in contact with the PDMS stamp.

References

[1] 3D-MID Technologie, Forschungsvereinigung Räumliche Elektronische Baugruppen 3-D MID e.V, Carl Hanser Verlag, München (2004)

[2] Electroless plating fundamentals & applications, Glenn O. Mallory & Juan B. Hajdu, (1990)

The invention claimed is:

1. A method for preparing a patterned electric circuit comprising the steps of:
    (a) providing a substrate;
    (b) providing a pattern of an inhibiting material for an electrical circuit onto said substrate by
        i) applying a layer of the inhibiting material onto said substrate and mechanically removing locally the layer of the inhibiting material to obtain said pattern; or
        ii) applying a layer of the inhibiting material onto said substrate, wherein said layer has pre-determined pattern which incompletely covers said substrate;
        wherein the inhibiting material comprises a material that decreases the rate of reaction of electroless deposition;
    (c) establishing a discontinuous distribution of particles of a first metal or alloy thereof on the layer of the inhibiting material and the pattern as obtained in step (b); and
    (d) depositing by means of an electroless process a layer of a second metal or alloy thereof on the distribution of the particles of the first metal or alloy thereof as obtained in step (c), whereby the inhibiting material that is still present on the substrate after step (b) locally inhibits the second metal or alloy thereof to be deposited on the first metal or alloy thereof, ensuring that the second metal or alloy thereof will selectively be deposited on the particles of the first metal or alloy thereof that are distributed on the pattern obtained in step (b).

2. A method for preparing a pattern for an electric circuit comprising the steps of:
    (a) providing a substrate, which substrate comprises a first metal or alloy thereof;
    (b) providing a pattern of an inhibiting material for an electrical circuit onto said substrate by
        i) applying a layer of the inhibiting material onto said substrate and mechanically removing locally the layer of the inhibiting material, thereby exposing at least part of the first metal or alloy thereof present in the substrate; or
        ii) applying a layer of the inhibiting material onto said substrate, wherein said layer has pre-determined pattern which incompletely covers said substrate, thereby exposing at least part of the first metal or alloy thereof present in the substrate;
        wherein the inhibiting material comprises a material selected from the group consisting of heavy metal ions, organic and inorganic sulphur, selenium or tellur containing compounds, dipyridyl and maleic acid;
    (c) depositing by means of an electroless process a layer of a second metal or alloy thereof on the exposed part of the first metal or alloy thereof present in the substrate as obtained in step (b), whereby the inhibiting material that is still present on the substrate after step (b) locally inhibits the second metal or alloy thereof to be deposited on the first metal or alloy thereof, ensuring that the second metal or alloy thereof will selectively be deposited on the exposed part of the first metal or alloy thereof as obtained in step (b).

3. A method for preparing a pattern for an electric circuit comprising the steps of:
    (a) providing a substrate having an outer skin part and an internal part, of which the skin part is more hydrophobic than the internal part of the substrate;
    (b) removing mechanically, thermally or laser-induced locally the skin part to obtain a pattern for an electric circuit, thereby exposing at least part of the internal part of the substrate;
    (c) establishing a discontinuous distribution of particles of a first metal or alloy thereof on the exposed part of the internal part of the substrate as obtained in step (b); and
    (d) depositing by means of an electroless process a layer of a second metal or alloy thereof on the particles of the first metal or alloy thereof that are distributed on the pattern in step (c);
    wherein in step (c) the establishing of a distribution of particles of a first metal or alloy thereof comprises adsorption of nanoparticles from a solution.

4. A method according to claim 1, wherein in step (c) the distribution of the particles of the first metal or alloy thereof is established by means of adsorption of nanoparticles or ions from a solution.

5. A method according to claim 1, wherein in step (b) the coating, the layer of inhibiting material or the skin part is mechanically removed by mechanical means selected from among mechanical milling, mechanical scraping, mechanical drilling, mechanical impressing, mechanical embossing and mechanical hot embossing.

6. A method according to claim 1, wherein the substrate comprises a thermoplastic product.

7. A method according to claim 6, wherein the substrate comprises LCP, polyamide, PEI, ABS or PC/ABS.

8. A method according to claim 1, wherein the first metal is selected from the group consisting of cobalt, nickel, copper, rhodium, palladium, platinum, silver and gold.

9. A method according to claim 8, wherein the first metal is palladium.

10. A method according to claim 1, wherein the second metal is selected from the group consisting of copper, nickel, nickel-phosphorous, nickel-boron, tin, silver, and gold or alloys thereof.

11. A method according to claim 10, wherein the second metal comprises copper, nickel-phosphorous or nickel-boron.

12. A method according to claim 1, wherein the inhibiting material comprises heavy metal ions, organic and inorganic sulphur-, selenium or tellur-containing compounds, oxygen containing compounds and aliphatic and unsatisfied organic compounds.

13. A method according to claim 12, wherein the inhibiting material comprises 2-mercaptobenzothiazole or thiourea.

14. An electric circuit comprising a pattern as prepared by means of a method according to claim 1.

15. A device comprising an electric device according to claim 14.

* * * * *